United States Patent
Lu et al.

(10) Patent No.: US 8,122,394 B2
(45) Date of Patent: Feb. 21, 2012

(54) PERFORMANCE-AWARE LOGIC OPERATIONS FOR GENERATING MASKS

(75) Inventors: Lee-Chung Lu, Taipei (TW); Chung-Te Lin, Tainan (TW); Yen-Sen Wang, Hsin-Chu (TW); Yao-Jen Chuang, Banciao (TW); Gwan Sin Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 407 days.

(21) Appl. No.: 12/212,088

(22) Filed: Sep. 17, 2008

(65) Prior Publication Data

US 2010/0065913 A1     Mar. 18, 2010

(51) Int. Cl.
- *G06F 17/50* (2006.01)
- *G06F 7/66* (2006.01)
- *G06K 9/00* (2006.01)
- *H01L 21/66* (2006.01)

(52) U.S. Cl. ............. 716/55; 438/14; 700/120; 382/144

(58) Field of Classification Search ............. 716/50–55; 438/14; 700/120; 382/144
See application file for complete search history.

(56) References Cited

U.S. PATENT DOCUMENTS

| | | | |
|---|---|---|---|
| 5,498,579 A * | 3/1996 | Borodovsky et al. | 716/53 |
| 6,189,136 B1 * | 2/2001 | Bothra | 716/53 |
| 6,327,695 B1 * | 12/2001 | Bothra et al. | 716/55 |
| 2008/0005718 A1 * | 1/2008 | Green | 716/21 |
| 2008/0169484 A1 * | 7/2008 | Chuang et al. | 257/190 |
| 2009/0095988 A1 * | 4/2009 | Rost | 257/255 |
| 2010/0187635 A1 * | 7/2010 | Beyer et al. | 257/369 |

\* cited by examiner

*Primary Examiner* — Stacy Whitmore
(74) *Attorney, Agent, or Firm* — Slater & Matsil, L.L.P.

(57) ABSTRACT

A method for forming masks for manufacturing a circuit includes providing a design of the circuit, wherein the circuit comprises a device; performing a first logic operation to determine a first region for forming a first feature of the device; and performing a second logic operation to expand the first feature to a second region greater than the first region. The pattern of the second region may be used to form the masks.

17 Claims, 8 Drawing Sheets

PERFORMANCE-AWARE LOGIC OPERATIONS FOR GENERATING MASKS

CROSS REFERENCE TO RELATED PROVISIONAL APPLICATION

This application claims the benefit of U.S. Provisional Application Ser. No. 61/036,354, filed Mar. 13, 2008 entitled, "Aware Logic Operations for Masks," which application is incorporated herein by reference.

TECHNICAL FIELD

This invention relates generally to the manufacturing of integrated circuits, and more particularly to the design of masks, and even more particularly to the logic operations in the design of the patterns on the masks.

BACKGROUND

In the manufacturing of integrated circuits, many lithography processes are involved to define the patterns of the components of the integrated circuits. The lithography processes typically involve applying a photo resist on a wafer, placing a mask covering the photo resist, wherein the mask contains desirable patterns, exposing the photo resist to light, and developing the photo resist. With the mask containing the patterns, some regions of the photo resist are exposed to the light, while other regions are not exposed. The exposed (or non-exposed) regions of the photo resist can thus be removed, and hence the patterns of the mask are transferred to the photo resist.

The design of the patterns on the mask often involves logic operations, during which patterns of some components are generated based on the design of other components of the integrated circuits. For example, the pattern of source and drain regions of a transistor may be formed using a logic operation "DIFFUSE BOOLEAN NOT POLY," which means that the source and drain regions may be generated by deducting the poly regions from the diffusion regions.

Conventional logic operations, however, suffer from limitations. For example, FIG. 1 illustrates the layout of two transistors, PMOS transistor 2 and NMOS transistor 12. PMOS transistor 2 includes diffusion region 6 and gate poly 4. NMOS transistor 12 includes diffusion region 16 and gate poly 14. The patterns of stressed contact etch stop layer (CESL) 8 and 18 are formed by performing logic operations to the patterns of PMOS transistor 2 and NMOS transistor 12, respectively. For example, by expanding the pattern of diffusion regions 6 and 16 by a constant distance $\Delta X$ in one direction and a constant distance $\Delta Y$ in another direction. To avoid design problems, in the conventional logic operations, CESLs 8 and 18 were spaced apart from each other to ensure that conventional design rules are followed.

The performance of PMOS device 2 and NMOS device 12 are related to the sizes of CESLs 8 and 18. However, in the conventional mask design, the sizes of CESLs 8 and 18 are not flexible even if there are additional spaces for increasing their sizes. Therefore, the device performance improvement that would have been obtained was not achieved. New logic operation methods are thus needed.

SUMMARY OF THE INVENTION

In accordance with one aspect of the present invention, a method for forming masks for manufacturing a circuit includes providing a design of the circuit, wherein the circuit includes a device; performing a first logic operation to determine a first region for forming a first feature of the device; and performing a second logic operation to expand the first feature to a second region greater than the first region. The pattern of the second region may be used to form the masks.

In accordance with another aspect of the present invention, a method for forming masks for manufacturing a circuit includes providing a design of the circuit, wherein the circuit includes a first device and a second device; performing a first logic operation to determine a first region for forming a first feature of the first device, and a second region for forming a second feature of the second device, wherein the first region is adjacent to the second region; determining a first performance of the circuit using the first region and the second region; performing a second logic operation to expand the first region to a third region, and to expand the second region to a fourth region; determining a second performance of the circuit using the third region and the fourth region; comparing the first performance and the second performance to generate a comparison result; and selecting results of one of the first logic operation and the second logic operation based on the comparison result to form the masks, wherein each of the masks includes opaque patterns and transparent patterns.

In accordance with yet another aspect of the present invention, a method for forming masks for manufacturing a circuit includes providing a design of the circuit, wherein the circuit includes a PMOS device and an NMOS device; and performing a logic operation to generate patterns of a first stressor layer for the PMOS device, and a second stressor layer for the NMOS device. The second stressor layer is rectangular. The first stressor layer includes a recess and the second stressor layer extends into the recess. The method further includes fabricating the masks containing the patterns of the first stressor layer and the second stressor layer.

In accordance with yet another aspect of the present invention, a semiconductor device includes a substrate; a PMOS transistor; and an NMOS transistor adjacent the PMOS transistor. The PMOS transistor includes a first gate over the substrate; a first source region adjacent to the first gate; a first drain region adjacent to, and on an opposite side of the first gate than, the first source region; and a first stressor layer over the first gate, the first source region, and the first drain region. The first stressor layer has a compressive stress. The first stressor layer includes a recess, with an edge of a portion of the first stress facing the recess being recessed toward the first gate than nearby edges of the first stressor layer. The NMOS transistor includes a second gate over the substrate; a second source region adjacent to the second gate; a second drain region adjacent to, and on an opposite side of the second gate than, the second source region; and a second stressor layer over the second gate, the second source region, and the second drain region. The second stressor layer has a tensile stress. The second stressor layer includes a portion extending into the recess of the first stressor layer.

The advantageous features of the present invention include flexible design of masks of integrated circuits and improved performance without sacrificing chip area usage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for designing masks using logic operations is provided. The variations of the preferred embodiments are then discussed. Throughout the various views and illustrative embodiments of the present invention, like reference numbers are used to designate like elements.

Logic operations are widely used by Boundaries to generate masks for manufacturing integrated circuits. Typically, the design of integrated circuits was provided to Boundaries in the form of graphic data system (GDS) files, which are typically in a binary format. Foundaries generate the masks by applying design rules, which are stored in design databases. The design rules may include design constraint files, which specify what the manufactured integrated circuits need to achieve, and rules that cannot be violated by the integrated circuits. The design of the integrated circuits is then used to generate a set of masks, which are used to define the patterns of the components of the integrated circuits. The masks typically include transparent portions allowing the light used in the lithography process to pass and opaque portions for blocking the light.

In the following discussion, the stressed contact etch stop layers (CESLs) for PMOS and NMOS devices are used as examples to explain the concept of the present invention. However, the concept of the present invention may be readily used for the design of masks of other components.

Figure 1:
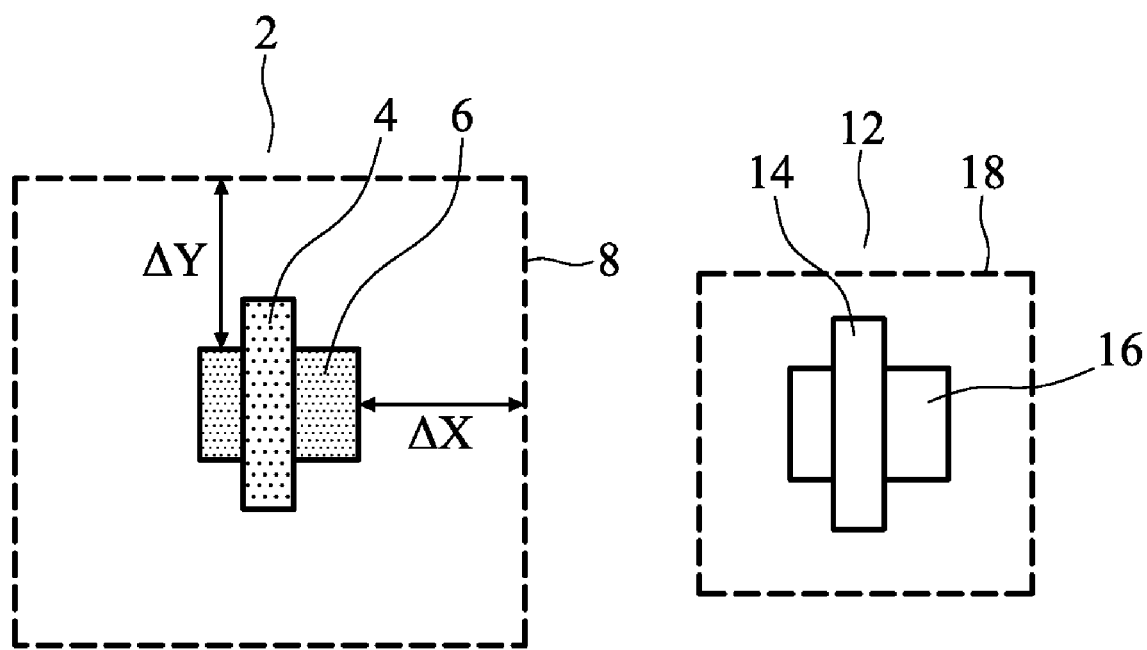
FIG. 1 illustrates a conventional scheme for performing a logic operation.
Figure 2A:
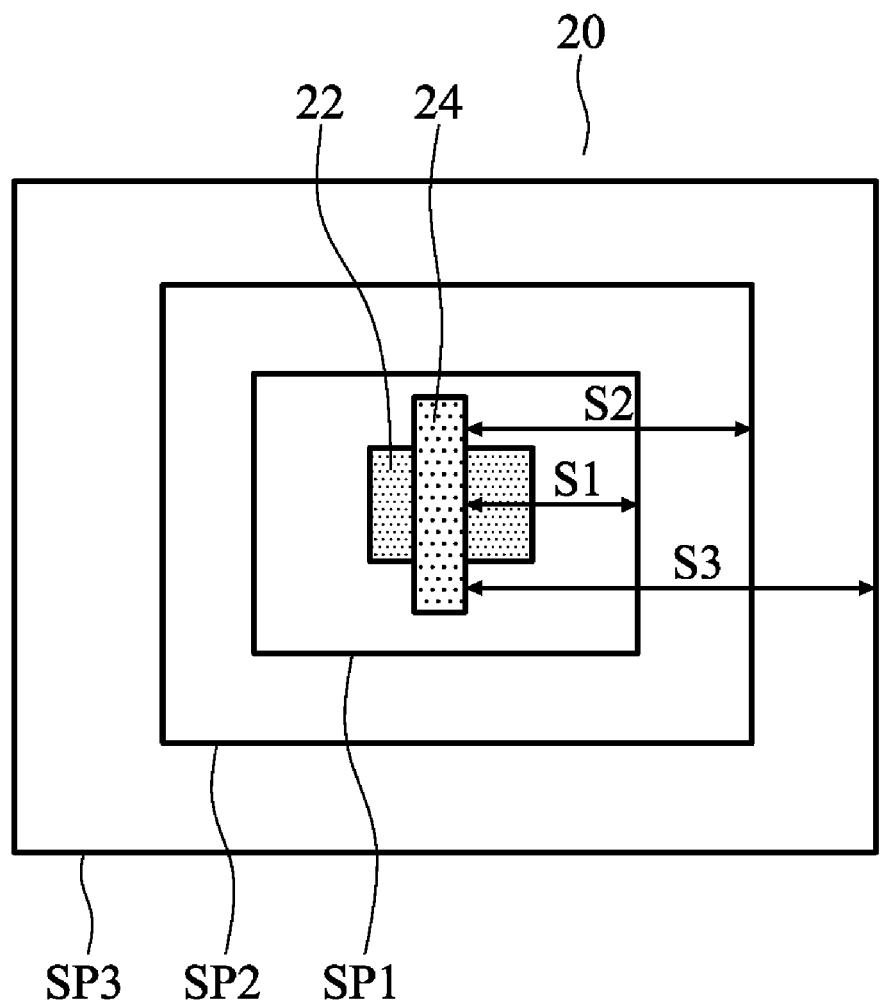
FIG. 2A illustrates a PMOS transistor, and possible patterns of a stressor layer of the PMOS transistor.
Figure 2B:
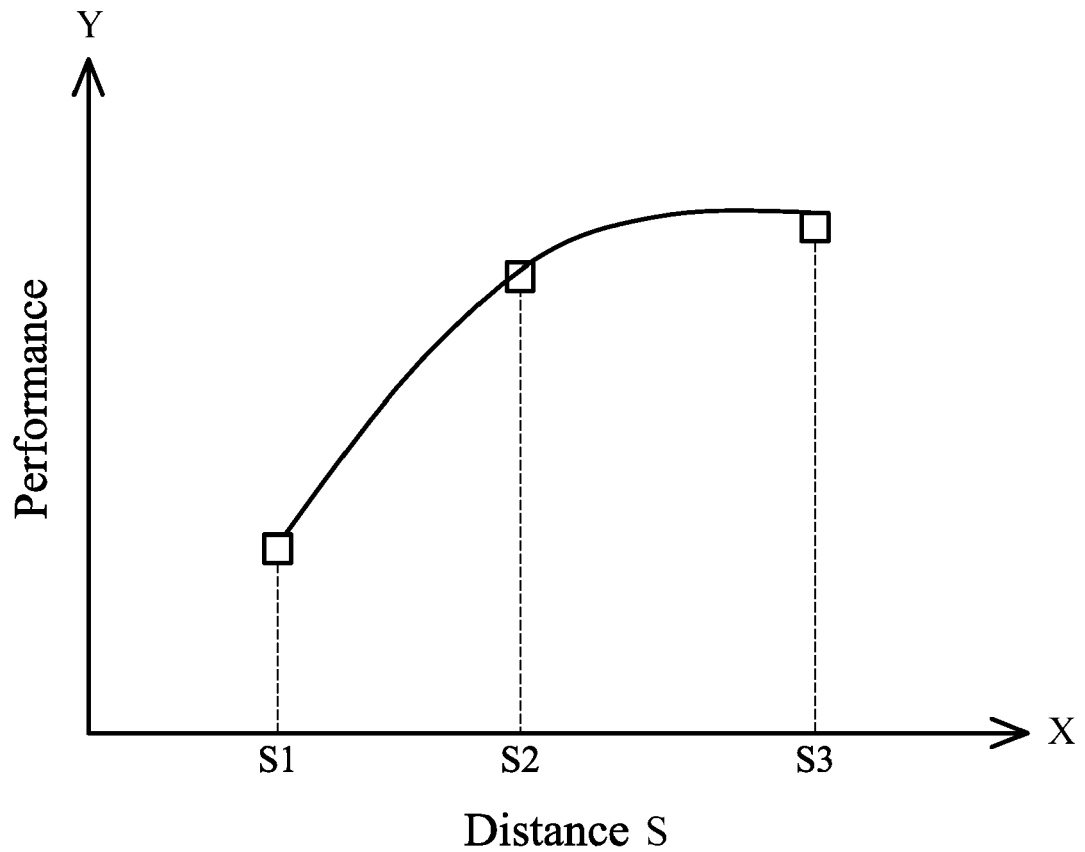
FIG. 2B illustrates the performance of the PMOS transistor as a function of the size of the stressor layer.

Referring to FIG. 2A, a top view (layout) of PMOS transistor 20 is illustrated. PMOS transistor 20 includes diffusion region (also referred to active region) 22 and gate electrode (also referred to as gate poly) 24 over diffusion region 22. A stressor layer, for example, CESL SP (shown as SP1, SP2, or SP3) is formed over diffusion region 22 and gate electrode 24. As is known in the art, for a PMOS transistor, the respective stressor layer preferably applies a compressive stress to the channel region of the PMOS transistor, so that the drive current of the PMOS transistor may be increased. It is realized that the increase in the drive current is related to the stress applied to the channel region, and in turn related to the size of stressor layer SP. A relationship between the performance of the PMOS device is illustrated in FIG. 2B. The X-axis represents the distance S between gate electrode 24 and the edge of stressed layer SP, which distance S reflects the size of the stressor layer SP. The Y-axis represents the performance of the PMOS transistor, which performance may be measured, for example, using its drive current (or saturation current). It is noted that when the distance S increases from S1 to S2, and to S3, the drive current also increases. Eventually, the increase in the drive current saturates even if distance S further increases.

Figure 3A:
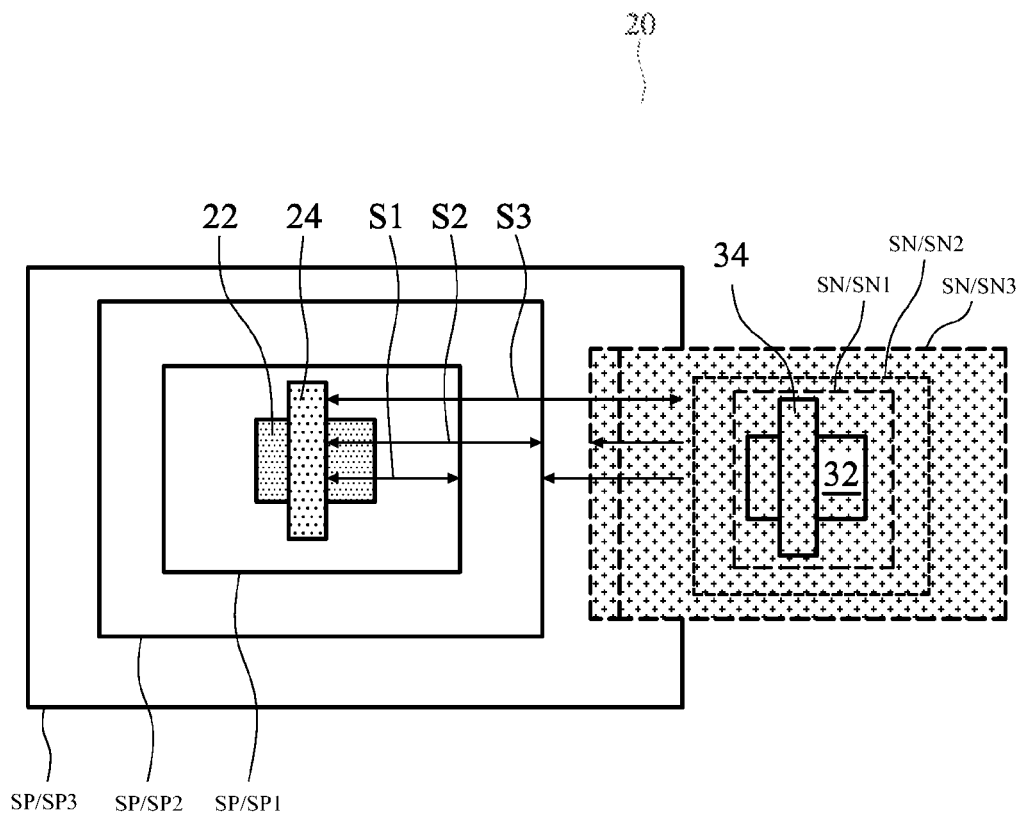
FIG. 3A illustrates a PMOS transistor and a neighboring NMOS transistor, and possible patterns of stressor layers over the PMOS transistor and the NMOS transistor.
Figure 3B:
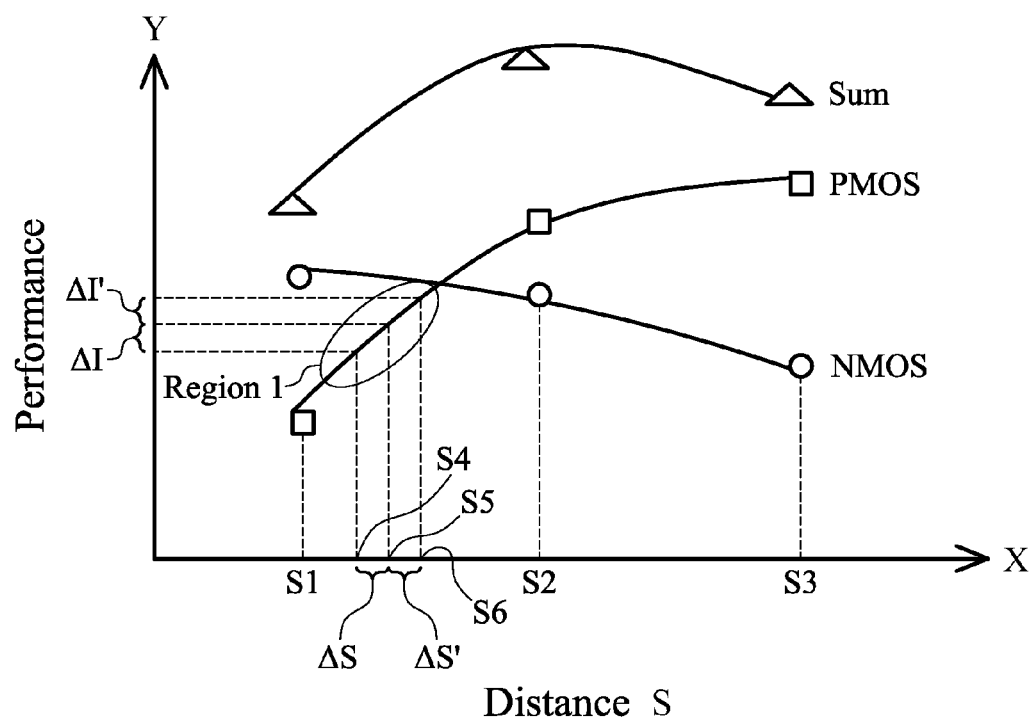
FIG. 3B illustrates the performance of the PMOS transistor, the performance of the NMOS transistor, and a global performance as functions of the sizes of the stressor layers.

FIG. 3A illustrates a top view of PMOS transistor 20 and NMOS transistor 30, which are next to each other. The stressor layer SN of NMOS transistor 30 has possible pattern of SN1, SN2, and SN3. FIG. 3B illustrates the performance of PMOS transistor 20 and NMOS transistor 30 as functions of distances S, which is also the distance S between gate electrode 24 and the edge of stressor layer SP. FIG. 3B is obtained by fixing the size of stressor layer SN to SN1, and measuring the performance (drive currents) of both PMOS transistor 20 and NMOS transistor 30. It is noted that with the increase in the size of stressor layer SP, the drive current of PMOS transistor 20 increases, while the drive current of NMOS transistor 30 decreases. The global performance, which may be the sum of the drive currents of the PMOS device and the drive current of the NMOS device, increases to a peak at a point (around distance S2) before it decreases again. From FIGS. 3A and 3B, it can be concluded that the global performance of PMOS transistor 20 and NMOS transistor 30 can be optimized by carefully designing the sizes of stressor layers SP and SN.

Figure 4:
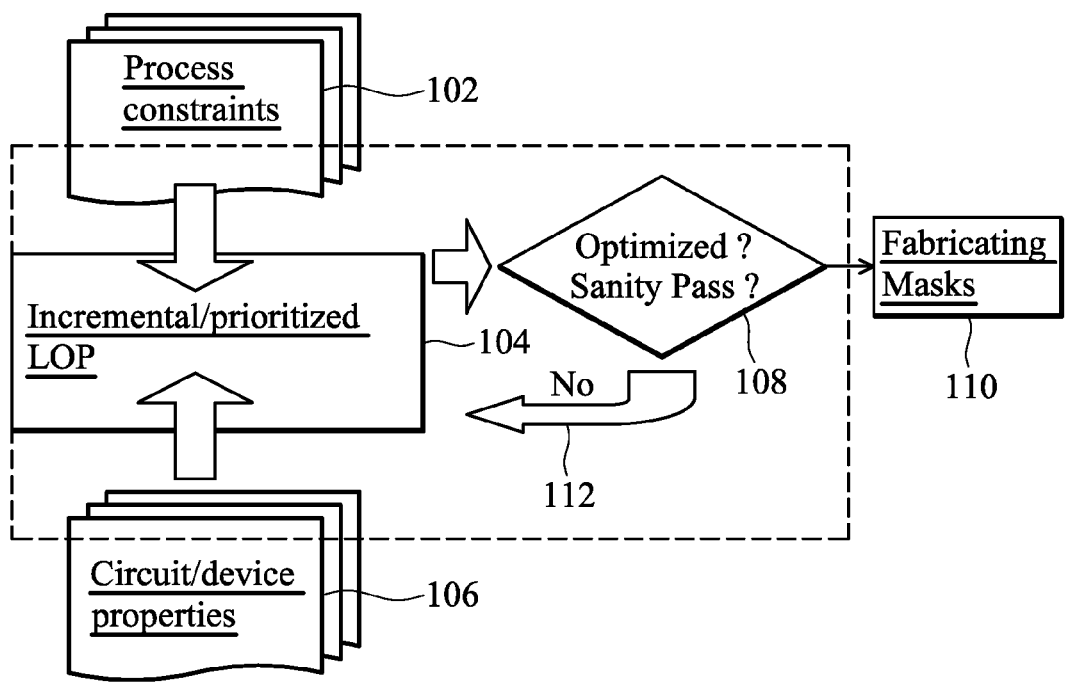
FIG. 4 illustrates a schematic workflow of an embodiment of the present invention.

Based on the findings discussed in FIGS. 2A through 3B, embodiments of the present invention are provided. The process for performing the embodiments of the present invention is discussed. A brief workflow of the present invention is schematically illustrated in FIG. 4. In the workflow, the process constrains (block 102) and the circuit/device properties (block 106) are taken into consideration of the mask design, which includes logic operations. In this case, the process constrains may include the minimum requirement for the devices, such as the minimum drive currents of PMOS and NMOS transistors, the minimum speed, or the like. The circuit/device properties (block 106) may include the layout specifications that may affect the performance of the devices, such as gate length, gate width, and/or the like. The circuit/device properties are used in the subsequent simulation for determining the performance of the integrated circuit. Incremental logic operations and/or prioritized logic operations, which may be combined into an integrated logic operation (LOP), are then performed to determine the patterns (which include the sizes) of the masks (block 104). The patterns, however, may only be intermediate patterns subject to further modification in subsequent additional iterations of logic operations, and hence may not be used to make the real (physical) masks. A performance check and a sanity check (block 108) are then performed to determine whether the performance of respective integrated circuit has been optimized or not, and whether any design rules have been violated by the logic operation. If the performance is not optimized, or the sanity check fails, the patterns need to be revised, and new performance checks and sanity checks are performed (arrow 112). The logic operation thus may contain one or more iterations. When the performance is substantially optimized, and the sanity check is passed, the respective patterns as results of the logic operations are used to make the physical mask (block 110).

Referring back to FIG. 3A, and using the design of stressor layers SP and SN as an example, in a first iteration, the stressor layers SP and SN have the sizes of SP1 and SN1, respectively. A performance check and a sanity check are then performed. The performance check may be performed by running a simulation program with integrated circuit emphasis (SPICE) simulation to determine the performance of both the PMOS transistor 20 and NMOS transistor 30, and a global performance, which may be evaluated by simply adding the drive currents of PMOS transistor 20 and NMOS transistor 30, or evaluated using other criteria. The determination of the global performance may also take into consideration other factors, such as the balance of the drive currents of PMOS and NMOS transistors. The performance data are saved.

The sanity check may include checking whether the stressor layers SP1 and SN1 have extended into forbidden areas they are not allowed to extend into. In the case the sanity check passes, the next iteration will be performed. However, if the sanity check fails, the patterns of stressor layers SP and SN obtained in the previous iteration, instead of the patterns obtained by the current iteration, will be adopted for forming masks.

In the next iteration (a second iteration), the sizes of stressor layers SP and SN are increased to SP2 and SN2, respectively. Another round of performance check is then performed, for example, using the SPICE simulation. If the performance data are better than the performance data obtained in the previous iteration, a sanity check will be performed. Otherwise, the pattern of the previous iteration, which includes stressor layers SP1 and SN1, will be used for forming masks. Again, if the sanity check fails, the patterns of the stressor layers SP1 and SN1, which were obtained in the previous iteration, will be adopted for forming masks even if the performance in this iteration is better than the previous one. On the other hand, if the performance is better than the previous one, and the sanity check passes, the performance data of the second iteration are saved, and a third iteration is further performed, with further expanded stressor layers SP3 and SN3. The iteration continues until eventually an optimized performance is obtained, while the respective patterns of stressor layers SP and SN do not fail the sanity check.

Referring to FIG. 3B, it can be found that by adopting the method as discussed in the preceding paragraphs, the stressor design with globally optimized performance may be found, for example, with distance S being close to S2.

In an embodiment, when an iteration is performed, the sizes of both stressor layers SP and SN are expanded over the preceding iterations. In alternative embodiment, only the size of one of stressor layers SP and SN is expanded, while the other is fixed. Further, the expansion of the stressor layers SP and SN may be wafer-based, and the sizes of the stressor layers of all PMOS transistors (or NMOS transistors) are expanded. However, the expansion may also be circuit-based, wherein only PMOS transistors (or NMOS transistors) of some of the circuits are expanded, while the PMOS transistors (or NMOS transistors) of other circuits are fixed. Further, the expansion may be customized. For example, for PMOS transistors, the expansion may be in both the channel width direction (the vertical direction in FIG. 3A) and in the channel length direction (the vertical direction in FIG. 3A), while for NMOS transistors, the expansion may be only in the channel length direction.

It is realized that performing (SPICE) simulation for each of the iterations results in significantly longer cycle time for the logic operations. Therefore, a sensitivity-aware approximation may be performed to reduce the number of iterations needed to achieve optimized global performance. For example, referring to FIG. 3B, in region 1, the increase in the performance is substantially linear relative to the increase in the distance S, therefore, if simulations have been performed for distances S4 and S5, which have the distance difference ΔS, and the respective difference in drive currents is ΔI, then the current increase ΔI' can be estimated as being (ΔS'/ΔS) * ΔI, wherein the current increase ΔI' is the current difference between the currents with distances S5 and S6. The performance of the NMOS transistor 20 and the global performance can also be estimated using similar methods. Accordingly, there is no need to run simulation for distance S6. Using the liner approximation, the number of simulations can be significantly reduced.

Figure 5A:
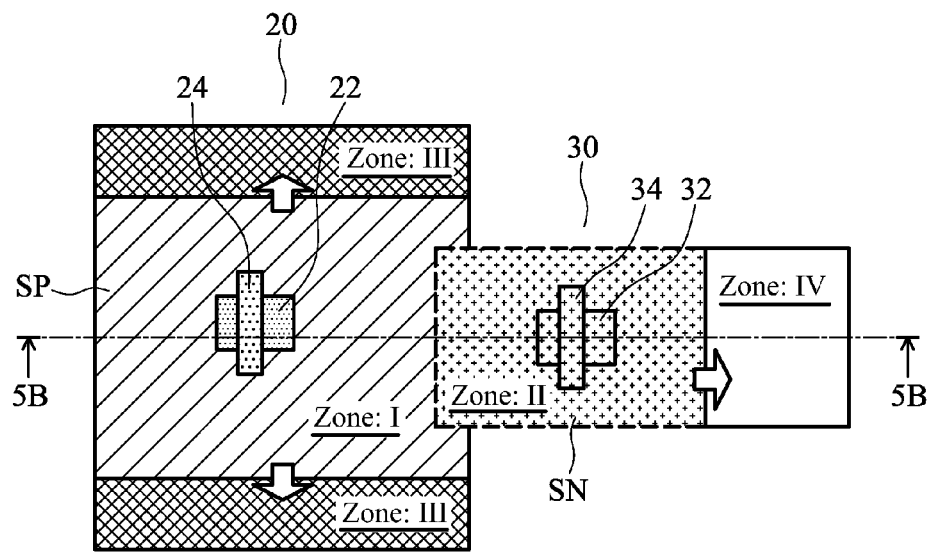
FIG. 5A illustrates a top view of an embodiment of the present invention.

It can be found from FIG. 3A that when stressor layers SP and SN are both expanded, they will eventually touch each other, and hence conflict occurs. The conflict may be resolved through prioritization. For example, the stressor layers SN of NMOS transistors may be set to a higher priority than the stressor layers SP of PMOS transistors. The respective logic operation may be performed using one of two approaches. In the first approach, the stressor SN of NMOS transistor 30 first occupies the chip area it needs. Next, the stressor layer SP of PMOS transistor 20 occupies the chip area it needs, except the stressor layer SP will not occupy the chip area already occupied by stressor layer SN. The resulting structure is shown in FIG. 5A. In a second approach, the stressor layer SP of PMOS transistor 20 does not expand in the direction toward NMOS 30 when the stressor layer SN expands. In other approaches, the stressor layer SP of PMOS transistor 20 may recede from the direction of NMOS 30, while stressor layer SN expands toward stressor layer SP.

FIG. 5A also illustrates the expansion of stressor layer SP toward gate width directions, and hence occupying zones III. On the other hand, NMOS device 30 may expand into zone IV. By expanding (through iterations) stressor layers SP and SN into non-used areas only toward selected directions, the performance of the integrated circuit may be improved without causing confliction. It is noted that the expansions of stressor layers SP and SN may have many possible approaches, which are also in the scope of the present invention. For example, the expansions of stressor layers SP and SN may be performed toward only one or two directions in each of the iterations, and the directions of the expansion may be rotated in a clockwise or counter clockwise direction when the iterations proceed.

Figure 5B:
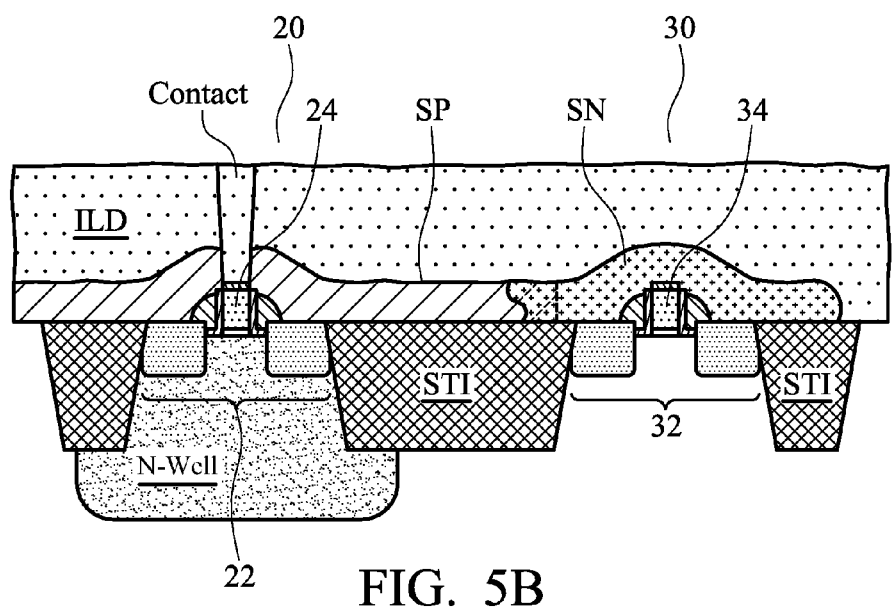
FIG. 5B illustrates a cross-sectional view of the embodiment shown in FIG. 5A.

It is realized that the mask pattern, and the layout shown in FIG. 5A, may be formed without resorting to repeated iterations. In an embodiment of the present invention, a single-step logic operation may be performed, with the sizes of stressor layers SP and SN specified greater than in conventional design. Apparently, this may cause the conflict, which may be resolved by using the prioritization as discussed in the preceding paragraphs. With stressor layer SN having a higher priority than stressor layer SP, the patterns as shown in FIG. 5A may be obtained through the single-step logic operation. A cross-sectional view of the structure as shown in FIG. 5A is illustrated in FIG. 5B, wherein the cross-sectional view is taken along a plane crossing line 5B-5B.

As mentioned in the preceding paragraphs, the teaching of the present invention may be applied to the logic operation of other features other than stressor layers. For example, PMOS transistors are formed in N-wells, and the sizes of the N-wells affect the performance of the PMOS transistors. The optimal sizes of the N-wells may thus be obtained by applying the teaching of the present invention.

Figure 6:
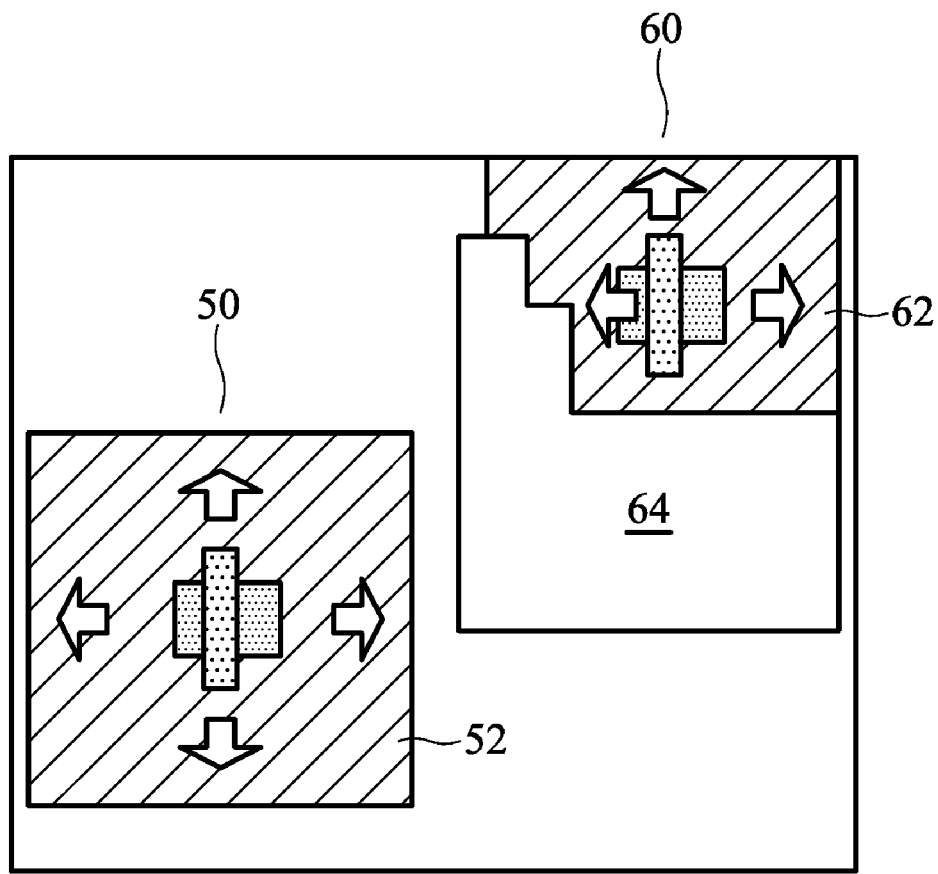
FIG. 6 illustrates a chip including different transistors with different stressor layer patterns.

By using the embodiments of the present invention, the patterns of the components of the integrated circuits may be customized. For example, referring to FIG. 6, on a same chip, stressor layer 52 of a first transistor 50 may be fully optimized, or expanded, while the stressor layer 62 of a second transistor 60 may be partially optimized due to the congestion or nearby forbidden zones 64.

The embodiments of the present invention have several advantageous features. First, with the performance-aware logic operations, the performance of the resulting integrated circuits may be optimized. This achievement, however, comes with no additional manufacturing steps, and no additional chip area usage. As a matter of fact, by using the embodiments of the present invention, chips may be designed smaller due to the better use of chip area.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a mask for manufacturing a circuit, the method comprising:
    providing a design of the circuit, wherein the circuit comprises a device;
    performing a first logic operation to determine a first region for forming a first feature of the device;
    performing a second logic operation to expand the first feature to a second region greater than the first region;
    after each of the step of performing the first logic operation and the step of performing the second logic operation, performing a performance evaluation of the device to select one of the first region and the second region corresponding to a better performance; and
    forming a mask for forming the first feature, wherein the mask comprises a pattern of at least one of the first region and the second region.

2. The method of claim 1 further comprising, after each of the step of performing the first logic operation and the step of performing the second logic operation, performing a sanity check on the circuit.

3. The method of claim 1 further comprising, after each of the step of performing the first logic operation and the step of performing the second logic operation, performing a sensitivity-aware approximation to determine an expansion ratio of the second region to the first region.

4. The method of claim 1, wherein the step of performing the first logic operation further comprises determining a third region for forming a second feature of an additional device in the circuit, wherein the third region is adjacent to the first region; and
    wherein the step of performing the second logic operation further comprises expanding the second feature from the third region to a fourth region greater than the third region.

5. The method of claim 4, wherein the first feature has a lower priority than the second feature, and wherein after the step of performing the second logic operation, the fourth region comprises a portion extending into a recess in the second region.

6. The method of claim 5, wherein the device and the additional device are a PMOS transistor and an NMOS transistor, respectively, and wherein the first feature is a compressive stressor layer of the PMOS transistor, and the second feature is a tensile stressor layer of the NMOS transistor.

7. A method for forming a mask for manufacturing a circuit, the method comprising:
    providing a design of the circuit, wherein the circuit comprises a first device and a second device;
    performing a first logic operation to determine a first region for forming a first feature of the first device, and a second region for forming a second feature of the second device, wherein the first region is adjacent to the second region;
    determining a first performance of the circuit using the first region and the second region;
    performing a second logic operation to expand the first region to a third region, and to expand the second region to a fourth region;
    determining a second performance of the circuit using the third region and the fourth region;
    comparing the first performance and the second performance to generate a comparison result;
    selecting results of one of the first logic operation and the second logic operation based on the comparison result to form the mask, wherein the mask comprises opaque patterns and transparent patterns; and
    forming the mask.

8. The method of claim 7, wherein the step of performing the second logic operation comprises:
    prioritizing and selecting a preferred feature from the first feature and the second feature;
    expanding the preferred feature; and
    expanding a remaining one of the first feature and the second feature, wherein the remaining one of the first feature and the second feature does not occupy a chip area occupied by the preferred feature.

9. The method of claim 7 further comprising additional iterations of steps, wherein in each of the iterations of steps, at least one of the first feature and the second feature has a changed area over in a preceding one of the iterations.

10. The method of claim 7, wherein the first device and the second device are a PMOS transistor and an NMOS transistor, respectively, and the first feature and the second feature are a compressive stressor layer and a tensile stressor layer, respectively.

11. The method of claim 10, wherein the tensile stressor layer has a priority higher than the compressive stressor layer.

12. The method of claim 10, wherein the fourth region is rectangular, and the third region has a recessed portion, and wherein the fourth region extends into the recessed portion.

13. The method of claim 10, wherein in the step of performing the second logic operation, the third region is expanded over the first region only in directions perpendicular to a direction connecting the first region and the second region, and wherein the fourth region is expanded over the second region only in a direction away from the first region.

14. The method of claim 7 further comprising:
    performing a first sanity check to the circuit using the first region and the second region, wherein the first sanity check passes;
    performing a second sanity check to the circuit using the third region and the fourth region, wherein the second sanity check fails; and selecting results of the first logic operation in the step of selecting results of one of the first logic operation and the second logic operation.

15. A method for forming a mask for manufacturing a circuit, the method comprising:
providing a design of the circuit, wherein the circuit comprises a PMOS device and an NMOS device;
performing a logic operation to generate patterns of a first stressor layer for the PMOS device, and a second stressor layer for the NMOS device, wherein the second stressor layer is rectangular, and the first stressor layer comprises a recess, and wherein the second stressor layer extends into the recess;
before the step of performing the logic operation, performing an additional logic operation for the first stressor layer and the second stressor layer, wherein additional patterns of at least one of the first stressor layer and the second stressor layer generated by the additional logic operation is smaller than a respective one of the patterns of the first stressor layer and the second stressor layer generated by the logic operation; and
fabricating the mask containing the patterns of the first stressor layer and the second stressor layer.

16. The method of claim 15, wherein before the step of fabricating the mask, only a single logic operation is performed for the first stressor layer and the second stressor layer.

17. The method of claim 15, wherein the step of performing the additional logic operation generates rectangular patterns for the first stressor layer and the second stressor layer.

* * * * *